(12) United States Patent
Yen et al.

(10) Patent No.: US 8,677,290 B2
(45) Date of Patent: Mar. 18, 2014

(54) METHOD OF FORMING AND USING PHOTOLITHOGRAPHY MASK HAVING A SCATTERING BAR STRUCTURE

(75) Inventors: Yung-Sung Yen, Hsin-Chu (TW); Kuei Shun Chen, Hsin-Chu (TW); Chien-Wen Lai, Hsin-Chu (TW); Cherng-Shyan Tsay, Miaoli (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 74 days.

(21) Appl. No.: 13/277,920

(22) Filed: Oct. 20, 2011

(65) Prior Publication Data

US 2012/0040276 A1 Feb. 16, 2012

Related U.S. Application Data

(60) Division of application No. 12/480,309, filed on Jun. 8, 2009, now Pat. No. 8,048,590, and a continuation-in-part of application No. 11/273,140, filed on Nov. 14, 2005, now abandoned.

(51) Int. Cl.
*G03F 1/36* (2012.01)
*G03F 1/80* (2012.01)
*G06F 17/50* (2006.01)

(52) U.S. Cl.
USPC .............................................. 716/55; 430/5

(58) Field of Classification Search
USPC ............................................................ 716/55
See application file for complete search history.

(56) References Cited

U.S. PATENT DOCUMENTS

| | | | |
|---|---|---|---|
| 5,766,806 A * | 6/1998 | Spence | 430/5 |
| 5,821,014 A | 10/1998 | Chen et al. | |
| 6,492,097 B1 | 12/2002 | Chen et al. | |
| 6,519,760 B2 | 2/2003 | Shi et al. | |
| 6,745,380 B2 | 6/2004 | Bodendorf et al. | |
| 6,787,272 B2 | 9/2004 | Yu | |
| 6,818,480 B2 | 11/2004 | Lee et al. | |
| 6,841,801 B2 | 1/2005 | Kim et al. | |
| 7,087,350 B2 | 8/2006 | Wang | |
| 2002/0192570 A1 | 12/2002 | Smith | |
| 2003/0165747 A1 * | 9/2003 | Magg | 430/5 |
| 2004/0170905 A1 * | 9/2004 | Liebmann et al. | 430/5 |
| 2005/0026047 A1 | 2/2005 | Yang | |
| 2005/0102648 A1 * | 5/2005 | Hsu et al. | 716/19 |
| 2005/0205961 A1 | 9/2005 | Doong | |

* cited by examiner

*Primary Examiner* — Mark F Huff
*Assistant Examiner* — John S Ruggles
(74) *Attorney, Agent, or Firm* — Haynes and Boone, LLP

(57) ABSTRACT

A method of forming a photolithography mask including forming a first linear non-dense feature on the mask and forming a plurality of parallel linear assist features disposed substantially perpendicular to the at least one linear non-dense design feature. In an embodiment, the photolithography mask further includes a first transverse linear assist feature disposed substantially transverse to the plurality of parallel linear assist features.

20 Claims, 5 Drawing Sheets

METHOD OF FORMING AND USING PHOTOLITHOGRAPHY MASK HAVING A SCATTERING BAR STRUCTURE

CROSS REFERENCE

The present application is a divisional of U.S. Utility application Ser. No. 12/480,309 filed on Jun. 8, 2009, now U.S. Pat. No. 8,048,590, issued Nov. 1, 2011, which is a Continuation-in-Part of U.S. patent application Ser. No. 11/273,140, filed Nov. 14, 2005 (now abandoned), the disclosures of which are hereby incorporated by reference in their entirety.

BACKGROUND

Photolithography is a process used in semiconductor integrated circuit device fabrication to produce device structures on semiconductor or other substrates. Distortions of device structures are becoming evident in view of the shrinking of the dimensions of the device structures as compared to the radiation wavelengths used during photolithography. One source of distortion is due to light scattered or otherwise affected by adjacent structures. Distortion in size and shape of the projected image exhibited by this phenomenon is called proximity effect.

In optical proximity correction (OPC), a resolution enhancement technique using scattering bars has been introduced to counter proximity effects and to reduce distortion. Scattering bars are sub-resolution assist features (SRAF) that are placed on a mask (e.g., reticle or photo-mask) adjacent to isolated features and/or semi-isolated features. Isolated and semi-isolated design features, such as metal lines, trenches, or gate polysilicon, are generally exposed and/or printed on the substrate at a feature size significantly different from the same design feature surround by other nearby features. This phenomenon is known as an isolated/dense proximity effect. The use of scattering bars enables these isolated and/or semi-isolated design features to form more like dense features. In this manner, the usable resolution of an imaging system may be extended without decreasing the radiation wavelength or increasing a numerical aperture of the imaging tool, although such processes can be used for additional benefit.

Conventional scattering bars are narrow lines placed adjacent to existing design features. The scattering bars are parallel with the isolated feature, often with scattering bars placed on either side of an isolated feature. These types of scattering bars are commonly called edge scattering bars. Where there are semi-isolated features, for example two parallel lines spaced apart from one another, a center scattering bar is typically placed in parallel with and between the semi-isolated features. However, when the semi-isolated features are beyond a certain distance apart, the center scattering bar becomes spaced too far from the semi-isolated features and the benefit of using scattering bars significantly diminishes.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
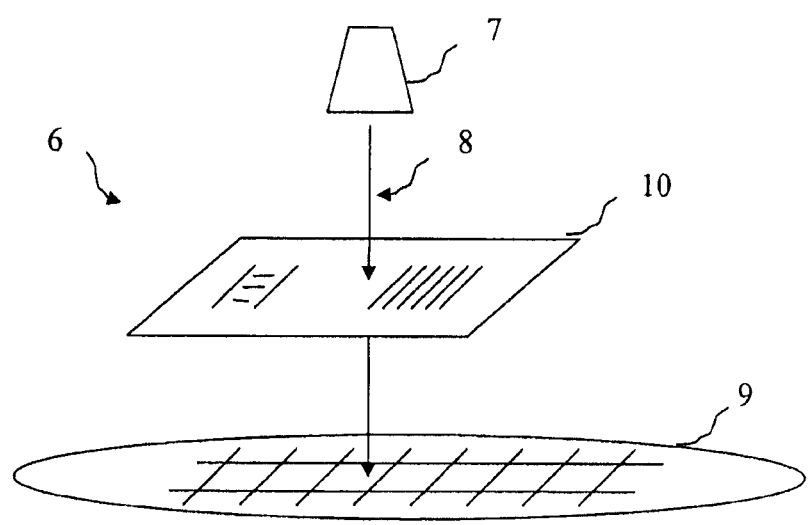
FIG. 1 is a block diagram of a photolithography system that can benefit from one or more embodiments of the present invention.

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Sub-wavelength photolithography has presented new challenges to producing or printing features such as metal lines, trenches, polysilicon structures, and so-forth onto a substrate. These challenges include image distortion in the form of line-end shortenings, corner roundings, isolated/dense proximity effects, and adverse impacts on the depth of focus (DOF). Resolution enhancement technologies (RET) have been devised to extend the usable resolution of an imaging system without decreasing the wavelength of the light or increasing the numerical aperture of the imaging tool. RET includes phase-shifting masks, off-axis illumination (OAI), and optical proximity correction (OPC). The present disclosure provides new and unique scattering bars to make isolated and semi-isolated features of a mask print more like features in a dense area of the mask. The term scattering bars refer to both scattering bars and anti-scattering bars. The disclosure herein introduces scattering bars that are placed proximate to existing isolated and semi-isolated features on a mask. The isolated and semi-isolated features are also referred to herein as "non-dense" features.

Referring to FIG. 1, the reference numeral 6 refers, in general, to a photolithography system that can benefit from one or more embodiments of the present invention. The photolithography system 6 includes a light source 7 for projecting a radiation 8 onto a substrate 9 through a mask 10. Although not shown, various lenses can also be provided, as well as other light manipulating and/or transmitting devices. In furtherance of the present embodiment, the substrate 9 is a semiconductor wafer for receiving an integrated circuit pattern from the mask 10. The patterns from the mask 10 will appear on a layer of the substrate 9, thereby creating an integrated circuit device, or chip, when combined with other layers. The mask 10 includes a plurality of design features, some of which are located in densely populated areas of the mask, others of which are located in areas that are not as dense.

Figure 2A:
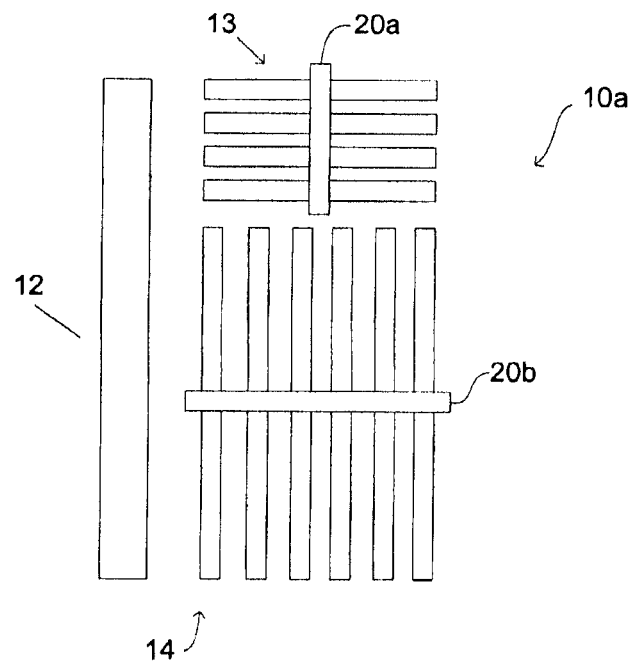
FIGS. 2a and 2b are simplified graphical representations of embodiments of a mask with scattering bars.

Referring now to FIG. 2a, the mask 10 of FIG. 1, herein referred to as mask 10a, includes a design feature 12 such as an isolated or semi-isolated, electrically connected metal line of an integrated circuit pattern. The design feature 12 is spaced far apart from other design features on one or both sides of the feature. The mask 10a also includes a first group of parallel scattering bars 13 disposed proximate to and substantially perpendicular to the feature 12. In some embodiments, the parallel scattering bars 13 may have one or more transverse scattering bars 20a running substantially perpendicular to the parallel scattering bars 13, as illustrated in FIG. 2a.

The scattering bars 13 and 20a can be either transparent or opaque, and for the sake of further example can be non-conducting (e.g., dummy) metal lines. The scattering bars 13 and 20a have a predefined width and pitch selected to enhance imaging of the feature 12. For example, the scattering bars 13 and/or scattering bars 20a may be extended as close to the design feature 12 as necessary for optimized imaging effect of the feature 12 during a lithography pattering process, while maintaining a predefined critical distance to the feature. Although the scattering bars 13 and 20a are illustrated as linear lines in FIG. 1, in alternative embodiments, the scattering bars 13 and 20a may be broken lines or other shapes. The scattering bars 13 and/or 20a may be disposed at various regions proximate the feature 12 and may be disposed in various groups, each having an individual width, pitch, and/or length.

Figure 2B:
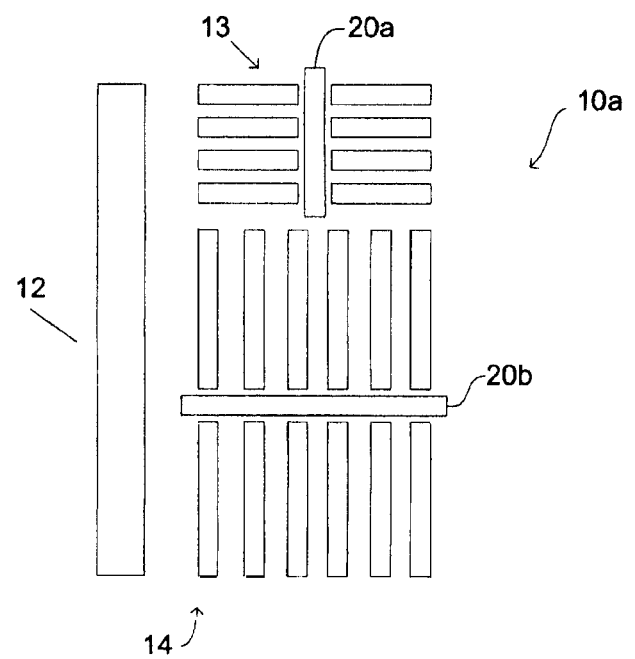

In the present embodiment, the mask 10a includes a second plurality of scattering bars 14 disposed proximate the feature 12. The scattering bars 14 are disposed substantially parallel with the feature 12. In some embodiments, the scattering bars 14 may have one or more transverse scattering bars 20b running substantially perpendicular to the scattering bars 14, as illustrated in FIG. 2a. FIG. 2b shows transverse scattering bars 20a and 20b running substantially perpendicular to scattering bars 13 and 14, respectively according to another embodiment of the present invention. The scattering bars 14 with transverse scattering bars 20b may be combined with the scattering bars 13 and transverse scattering bars 20a in various ways such as those examples illustrated in FIGS. 2a to 5. For example, the scattering bars 14 may be disposed in one region and the scattering bars 13 may be disposed in another region of the mask 10a. A procedure to place various perpendicular and/or parallel scattering bars along with transverse scattering bars may be rule-based with a set of predefined rules or model-based with various options including width, pitch, and/or other parameters for optimizing an imaging effect. Since vertical scattering bars (or assist features) are employed, scattering bars are capable of being disposed effectively such as with increased scattering bar area. In alternative embodiments, combination of perpendicular, parallel, transverse and tilted scattering bars may be used, as desired.

Figure 3:
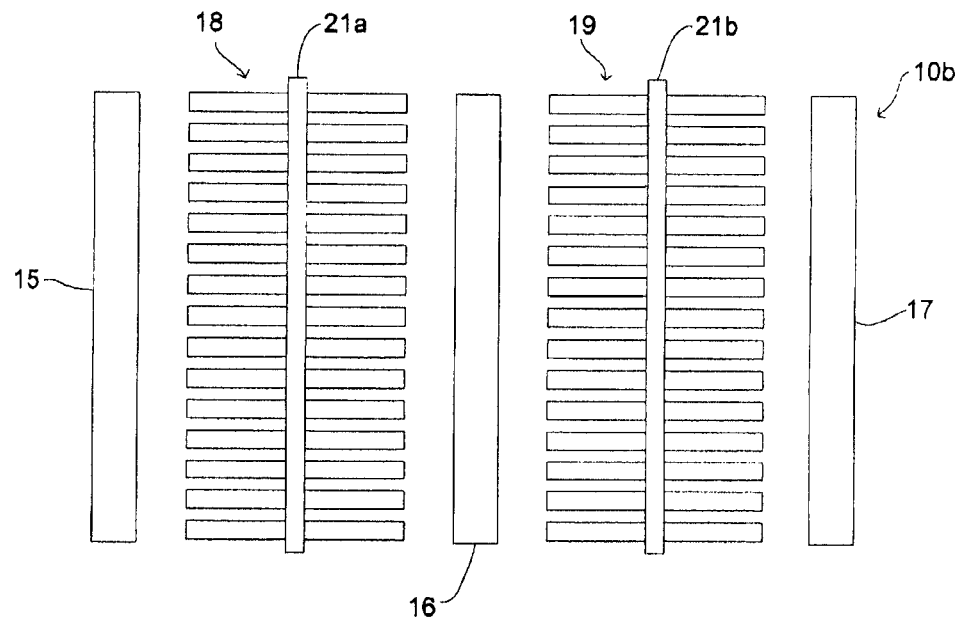
FIG. 3 is a simplified graphical representation of an embodiment of a mask with center scattering bars.

Referring now to FIG. 3, in another embodiment, the mask 10 of FIG. 1, herein referred to as mask 10b, includes semi-isolated features 15, 16, 17 and two groups of center scattering bars 18, 19. In the present example, semi-isolated features 15-17 are spaced apart and arranged generally parallel with one another. In conventional OPC, a single center scattering bar (CSB) would be centered and placed in parallel between adjacent semi-isolated features 15 and 16, and another CSB would be placed between adjacent semi-isolated features 16 and 17. However, this does not improve the DOF because the distance between the scattering bars and the existing design features is too large. Instead, a plurality of new scattering bars are formed perpendicular to the existing features 15-17. As shown in FIG. 3, a first series of parallel scattering bars 18 is formed and placed in between and perpendicular to semi-isolated features 15 and 16. In some embodiments, the parallel scattering bars 18 may have one or more transverse scattering bars 21a running substantially perpendicular to the parallel scattering bars 18. A second series of parallel scattering bars 19 is placed in between and perpendicular to semi-isolated features 16 and 17. In some embodiments, the parallel scattering bars 19 may have one or more transverse scattering bars 21b running substantially perpendicular to the parallel scattering bars 19. The series of parallel scattering bars 18, 19 with or without transverse scattering bars 21a, 21b, respectively, formed perpendicularly to the existing non-dense design features 15-17 creates a region of dense features to mitigate or eliminate proximity effects and improve the DOF.

Figure 4:
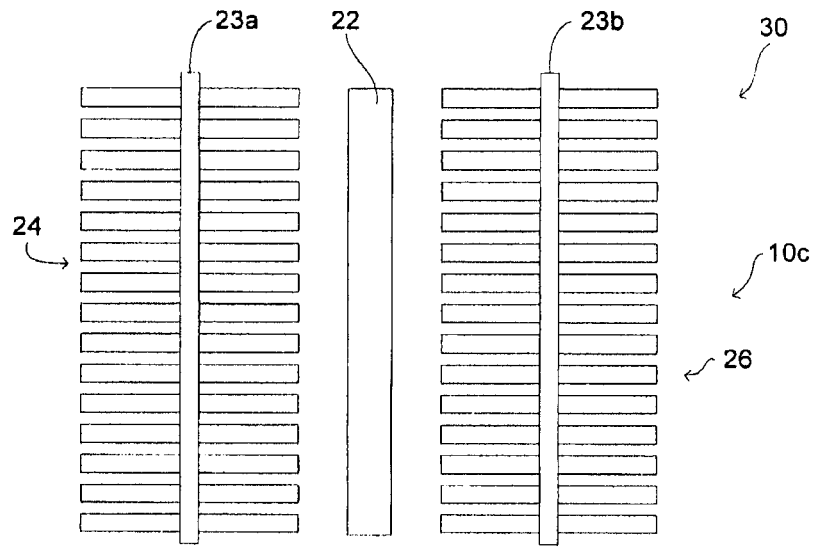
FIG. 4 is a simplified graphical representation of an embodiment of a mask with edge scattering bars.

Referring now to FIG. 4, in another embodiment, the mask 10 of FIG. 1, herein referred to as mask 10c, includes an isolated feature 22 surrounded on both sides by edge scattering bars 24, 26. In conventional OPC, two parallel edge scattering bars (ESBs) would be placed in parallel on each side of isolated feature 22. According to the method described herein, a first series of parallel scattering bars 24 are placed adjacent and perpendicular to isolated feature 22 on one side, and a second series of parallel scattering bars 26 are placed adjacent and perpendicular to isolated feature 22 on the other side. In some embodiments, parallel scattering bars 24 may have one or more substantially transverse scattering bars 23a running substantially perpendicular to the scattering bars 24. In other embodiments, parallel scattering bars 26 may have one or more transverse scattering bars 23b running substantially perpendicular to the parallel scattering bars 26.

Figure 5:
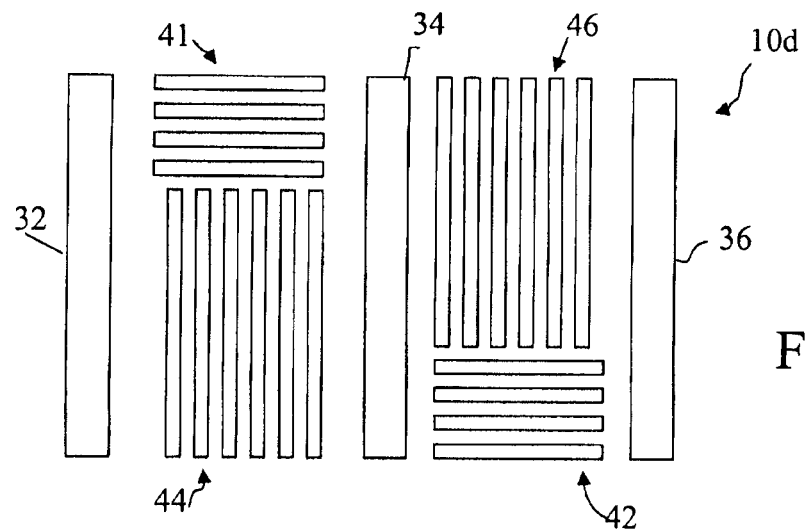
FIG. 5 is a simplified graphical representation of another embodiment of a mask with scattering bars.

Referring now to FIG. 5, in another embodiment, the mask 10 of FIG. 1, herein referred to as mask 10d, includes semi-isolated or non-dense design features 32, 34, 36. In the present embodiment, non-dense features 32-36 may be spaced apart and arranged generally parallel with one another, although such an arrangement is not required. In this embodiment, scattering bars oriented parallel with the semi-isolated features as well as scattering bars oriented perpendicularly with the semi-isolated features are added to the mask design. A first series of parallel scattering bars 41 are formed and placed between and perpendicular to non-dense features 32 and 34. A second series of parallel scattering bars 44 are placed in parallel between non-dense features 32 and 34. On the other side of non-dense feature 34 are a series of parallel scattering bars 42 formed and placed perpendicularly to semi-isolated features 34 and 36. On the same side of semi-isolated feature 34, a second series of parallel scattering bars 46 are placed in parallel between non-dense features 34 and 36. In some embodiments, parallel scattering bars 41, 44, 42, and 46 may each have one or more transverse scattering bars (not shown) running substantially perpendicular to the respective scattering bars 41, 44, 42, and 46. This example illustrates an embodiment in which parallel and perpendicular scattering bars may both be employed in OPC. These parallel and perpendicular scattering bars create a region of dense features that mitigates or eliminates proximity effects and improves the DOF.

Figure 6:
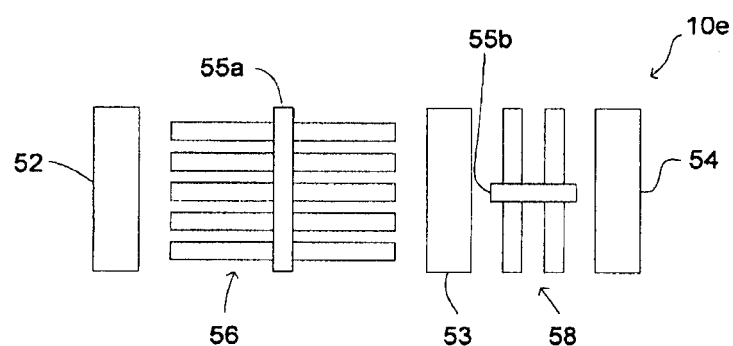
FIG. 6 is a simplified graphical representation of yet another embodiment of a mask with scattering bars.

Referring now to FIG. 6, in another embodiment, the mask 10 of FIG. 1, herein referred to as mask 10e, includes semi-isolated or non-dense features 52, 53, 54. Semi-isolated features 52-54 may be spaced apart and arranged generally parallel with one another. In this embodiment, scattering bars oriented parallel with the semi-isolated features as well as scattering bars oriented perpendicularly with the semi-isolated features are added to the mask design. A first series of parallel scattering bars 56 are formed and placed between and perpendicular to semi-isolated features 52 and 53. A second series of parallel scattering bars 58 are placed in parallel with and between semi-isolated features 53 and 54. In some embodiments, parallel scattering bars 56 may have one or more transverse scattering bars 55a running substantially perpendicular to the parallel scattering bars 56. In other embodiments, parallel scattering bars 58 may have one or more transverse scattering bars 55b running substantially transverse to the parallel scattering bars 58. This example illustrates an embodiment in which parallel and perpendicular scattering bars may both be employed in OPC. These parallel and perpendicular scattering bars create a region of dense features that mitigates or eliminates proximity effects and improves the DOF.

Figure 7:
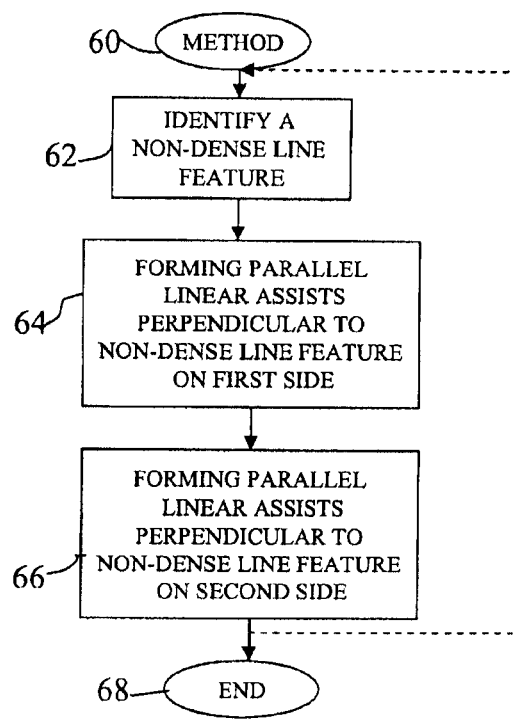
FIG. 7 is a simplified flowchart of an embodiment of a method of adding and arranging scattering bars to a mask.

FIG. 7 is a simplified flowchart 60 of an embodiment of a method for adding scattering bars. The method 60 may be incorporated with one or more other OPC methods in processing an overall design for the mask 10 (FIG. 1). In step 62, a non-dense design feature is identified. This includes isolated and semi-isolated feature features already existing in the mask design. One way to identify a non-dense design feature is to have a minimum size for a scattering bar and to determine if such a scattering bar can be positioned between two design features while maintaining design rule requirements.

At step 64, a plurality of scattering bars are formed perpendicular to the non-dense design feature on a first side. In some embodiments, a plurality of parallel scattering bars may be formed parallel with the non-dense design feature on the same side and combined with the perpendicular scattering bars. Various combinations may be implemented using a rule-based method, model-based method, or other proper methods for optimized imaging of the non-dense design feature during a lithography patterning process. In another embodiment, the above described scattering bars may be disposed between two non-dense design features.

At step 66, a second plurality of scattering bars may be formed on the second side of the non-dense design feature and placed perpendicularly with respect to the design feature. A set of parallel scattering bars may be collectively disposed on the second side of the non-dense design feature. In some embodiments, the scattering bars may each have one or more transverse scattering bars running substantially transverse thereto. This process may be repeated for each identified isolated and semi-isolated feature to increase the design density around these isolated and semi-isolated feature features. After all non-dense design features have been processed, the process ends in step 68.

The method 60 only serves as an example as to how the parallel scattering bars and scattering bars transverse to the parallel scattering bars may be incorporated into a mask pattern, and it is understood that other methods may be used, as is understood by those skilled in the art. For example, a region having non-dense design features may be identified and various perpendicular scattering bars and optional parallel scattering bars are disposed such that the imaging of the non-dense design features in the selected region is enhanced and optimized. The identified region may have a dimension to include at least portion of a non-dense design feature, one non-dense design feature, or a plurality of non-dense design features. For example, the identified region may include a round area having a predefined radius.

Using the scattering bars as described above, the lithography DOF is increased without introducing additional semiconductor fabrication steps. These additional assist features increase the DOF and resolution for isolated and semi-isolated feature features, and also reduce a mask error enhancement factor (MEEF). The manufacture of such assist features is also relatively easy, because the assist features are easily programmable with existing design-rule check (DRC) tools. It has been shown that the lithography process window increases approximately 20% when the perpendicular scattering bars are compared with the conventional parallel scattering bars. Further, there is more degree of freedom in the placement of the scattering bars described in this disclosure. Depending on the application, the optimal width of the scattering bars, the optimal spacing between the scattering bars, and the optimal spacing between the scattering bar and the existing isolated or semi-isolated feature may be determined on a case-by-case basis.

Thus, the present disclosure provide many embodiments of masks, methods for making masks, photolithography systems, and devices produced by such systems.

In one embodiment, a photolithography mask includes a design feature located in an isolated or semi-isolated region of the mask and a plurality of parallel linear assist features disposed substantially perpendicular to the design feature. In some embodiments, the plurality of parallel linear assist features include a first series of parallel assist features disposed on a first side of the design feature and perpendicularly thereto, and a second series of parallel assist features disposed on a second side of the design feature and perpendicularly thereto.

In one embodiment, a method of forming a mask includes forming a first non-dense feature on the mask and forming a plurality of parallel assist features disposed substantially perpendicular to the at least one non-dense design feature.

In one embodiment, a device, such as a semiconductor device, includes at least one linear non-dense feature on a first layer of the semiconductor device and a plurality of parallel linear assist features on the first layer of the semiconductor device, disposed substantially perpendicular to the at least one linear non-dense feature.

Although embodiments of the present disclosure have been described in detail, those skilled in the art should understand that they may make various changes, substitutions and alterations herein without departing from the spirit and scope of the present disclosure. For example, an assist feature can be created as a part of a previous design feature. More specifically, an assist feature can be a protrusion from a nearby design feature, arranged and positioned proximate to another non-dense design feature as in one of the embodiments listed above. Accordingly, all such changes, substitutions and alterations are intended to be included within the scope of the present disclosure as defined in the following claims.

What is claimed is:

1. A method of forming a mask comprising:
   forming a first linear non-dense feature on the mask;
   forming a plurality of parallel linear assist features disposed substantially perpendicular to the first linear non-dense feature, wherein each of the plurality of parallel linear assist features has a first portion and a collinear second portion; and
   forming a transverse linear assist feature on the mask, wherein the transverse linear assist feature is disposed perpendicular and transverse to the plurality of parallel linear assist features such that the first portion of each of the plurality of parallel linear assist features is disposed on a first side of the transverse linear assist feature and the second portion of each of the plurality of parallel linear assist features is disposed on a second, opposing side of the transverse linear assist feature.

2. The method of claim 1, wherein forming the plurality of parallel linear assist features comprises:
   adding a first series of parallel assist features disposed on a first side of the first linear non-dense feature and substantially perpendicular thereto; and
   adding a second series of parallel assist features disposed on a second side of the first linear non-dense feature.

3. The method of claim 1, further comprising:
forming a second linear non-dense feature parallel to the first linear non-dense feature on the mask; and
wherein forming the plurality of parallel linear assist features comprises:
adding a first series of parallel assist features disposed between the first and second parallel linear non-dense features and substantially perpendicular to both features; and
adding a second series of parallel assist features disposed between the first and second parallel non-dense features and substantially parallel to both of the first and second parallel linear non-dense features.

4. The method of claim 3, further comprising:
forming a third linear non-dense feature parallel to the second linear non-dense feature on the mask, and wherein forming the plurality of parallel linear assist features further comprises:
adding a third series of parallel assist features disposed between the third and second parallel linear non-dense features and substantially perpendicular to both features; and
adding a fourth series of parallel assist features disposed between the third and second parallel non-dense features and substantially parallel to both of the parallel linear non-dense features.

5. The method of claim 1, wherein the plurality of parallel linear assist features includes forming the first portion of each of the plurality of linear assist features spaced a distance from the respective second portion of each of the plurality of linear assist features.

6. The method of claim 5, wherein the transverse linear assist feature is disposed in the space.

7. A method of fabricating a photolithography mask, comprising:
forming a design feature located in a first region of the photolithography mask;
forming a plurality of parallel linear assist features disposed substantially perpendicular to the design feature; and
forming a transverse linear assist feature, wherein the transverse linear assist feature is disposed perpendicular and transverse to the plurality of parallel linear assist features, wherein the forming of the transverse linear assist feature includes forming the transverse linear assist feature such that a first portion of at least one of the plurality of parallel linear assist features is disposed on a first side of the transverse linear assist feature and a second portion of the at least one of the plurality of parallel linear assist features is disposed on a second, opposing side of the transverse linear assist feature.

8. The method of claim 7, wherein the first region is at least one of an isolated and a semi-isolated region.

9. The method of claim 7, wherein the first portion of the at least one parallel linear assist feature is spaced a first distance from the first side of the transverse linear assist feature and the second portion of the at least one parallel linear assist feature is spaced a second distance from the second, opposing side of the transverse linear assist feature.

10. The method of claim 7, wherein the forming of the design feature includes forming a substantially linear and isolated feature.

11. The method of claim 7, wherein the forming the plurality of parallel linear assist features is performed by one of a model-based method and a rule-based method.

12. The method of claim 7, further comprising:
locating a second design feature on the photolithography mask;
forming a second plurality of parallel linear assist features disposed substantially perpendicular to the second design feature; and
forming a second transverse linear assist feature, wherein the second transverse linear assist feature is disposed perpendicular and transverse to the second plurality of parallel linear assist features.

13. The method of claim 7, wherein the forming of the plurality of parallel linear assist features includes depositing and patterning generally opaque material.

14. The method of claim 13, wherein the generally opaque material includes metal.

15. A method of providing a photomask, the method comprising:
forming a first feature on the photomask, wherein the first feature is a pattern associated with a feature of a semiconductor device;
using at least one of a model-based method and a rule-based method to determine the location of a plurality of parallel linear assist features;
using the determined location to form the plurality of parallel linear assist features on the photomask, disposed substantially perpendicular to the first feature, wherein each of the plurality of parallel linear assist features has a first portion and a collinear second portion; and
forming a transverse linear assist feature on the photomask and disposed substantially perpendicular to the plurality of parallel linear assist features, wherein the transverse linear assist feature interposes the first portion and the collinear second portion of each of the plurality of parallel linear assist features.

16. The method of claim 15, wherein the forming of the transverse linear assist feature includes providing a space between the transverse linear assist feature and the first portions of the plurality of parallel linear assist features.

17. The method of claim 15, wherein the feature of the semiconductor device is a substantially linear and isolated feature.

18. The method of claim 17, wherein the substantially linear and isolated feature defines at least one of a metal line, a trench, and a gate.

19. The method of claim 15, further comprising:
forming a second plurality of parallel linear assist features on the photomask and disposed substantially parallel with the first feature.

20. The method of claim 19, further comprising:
forming a second transverse linear assist feature substantially transverse to the second plurality of parallel linear assist features, wherein each of the second plurality of parallel linear assist features includes a first portion and a collinear second portion, and wherein the second transfer linear assist feature interposes the first and second portions.

* * * * *